(12) United States Patent
Wu et al.

(10) Patent No.: US 7,456,424 B2
(45) Date of Patent: *Nov. 25, 2008

(54) THIN FILM TRANSISTORS INCLUDING INDOLOCARBOZOLES

(75) Inventors: Yiliang Wu, Mississauga (CA); Beng S. Ong, Mississauga (CA); Yu Qi, Oakville (CA); Yuning Li, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 45 days.

This patent is subject to a terminal disclaimer.

(21) Appl. No.: 11/167,485

(22) Filed: Jun. 27, 2005

(65) Prior Publication Data

US 2006/0124923 A1    Jun. 15, 2006

Related U.S. Application Data

(63) Continuation-in-part of application No. 11/011,441, filed on Dec. 14, 2004, now abandoned.

(51) Int. Cl.
*H01L 29/08* (2006.01)
(52) U.S. Cl. ............................ 257/40; 257/59; 257/72; 257/E51.028; 257/E51.035
(58) Field of Classification Search .................. 257/40, 257/E51.028, E51.035
See application file for complete search history.

(56) References Cited

U.S. PATENT DOCUMENTS

| | | | |
|---|---|---|---|
| 5,604,219 A * | 2/1997 | Murakata et al. | 514/211.08 |
| 5,843,607 A | 12/1998 | Hu et al. | |
| 5,942,340 A | 8/1999 | Hu et al. | |
| 5,952,115 A | 9/1999 | Hu et al. | |
| 6,740,900 B2 * | 5/2004 | Hirai | 257/40 |
| 6,774,393 B2 * | 8/2004 | Murti et al. | 257/40 |
| 6,794,220 B2 * | 9/2004 | Hirai et al. | 438/99 |
| 6,872,801 B2 * | 3/2005 | Ong et al. | 528/373 |
| 6,949,762 B2 * | 9/2005 | Ong et al. | 257/40 |
| 2004/0129978 A1 * | 7/2004 | Hirai | 257/347 |
| 2006/0124921 A1 * | 6/2006 | Ong et al. | 257/40 |
| 2006/0214155 A1 * | 9/2006 | Ong et al. | 257/40 |

FOREIGN PATENT DOCUMENTS

DE    19831427 A1 *   1/2000
EP    906948 A1 *   4/1999

OTHER PUBLICATIONS

Wu et al., "Indolo[3,2-b]carbazole-Based Thin-Film Transistor with High Mobility and Stability", 2004, J. Am. Chem. Soc., vol. 127, pp. 614-618.*
Li et al., "Novel Peripherally Substituted Indolo[3,2-b]carbazole for High-Mobility Organic Thin-Film Transistors," 2005, Advanced Materials, vol. 17, No. 7, pp. 849-852.*
Dimitrakopoulos et al., Organic Thin Film Transistors for Large Area Electronics, 2002, Advanced Materials, vol. 14, No. 2, pp. 99-117.*
Beng S. Ong et al., U.S. Appl. No. 11/011,678, filed Dec. 14, 2004, titled "Compound With Indolocarbazole Moieties and Devices Containing Such Compound" is a continuation-in-part application of co-pending Beng S. Ong et al., U.S. Appl. No. 11/011,678, filed Dec. 14, 2004.

(Continued)

*Primary Examiner*—Jerome Jackson
*Assistant Examiner*—Jose R Diaz
(74) *Attorney, Agent, or Firm*—Zosan Soong

(57) ABSTRACT

A thin film transistor composed of a semiconductor layer including an optionally substituted indolocarbazole.

17 Claims, 2 Drawing Sheets

OTHER PUBLICATIONS

Yuning Li et al., U.S. Appl. No. 11/011,901, filed Dec. 14, 2004, titled "Process to Form Compound With Indolocarbazole Moieties."

Christos D. Dimitrakopoulos et al., "Organic Thin Film Transistors for Large Area Electronics," *Adv. Mater.*, vol. 14, No. 2, pp. 99-117 (2002).

Salem Wakim et al., "Organic Microelectronics: Design, Synthesis, and Characterization of 6, 12-Dimethylindolo[3,2-b]Carbazoles," *Chem. Mater.* vol. 16, No. 23, pp. 4386-4388 (published on web Jul. 7, 2004).

Nan-Xing Hu et al., "5-11-Dihydro-5,11-di-1-naphthylindolo[3,2-b]carbazole: Atropisomerism in a Novel Hole-Transport Molecule for Organic Light-Emitting Diodes," *J. Am. Chem. Soc.*, vol. 121, pp. 5097-5098 (1999).

* cited by examiner

THIN FILM TRANSISTORS INCLUDING INDOLOCARBOZOLES

CROSS-REFERENCE TO RELATED APPLICATIONS

This application is a continuation-in-part application of U.S. application Ser. No. 11/011,441 (filing date Dec. 14, 2004) now abandoned from which priority is claimed, the disclosure of which is totally incorporated herein by reference.

Beng S. Ong et al., U.S. application Ser. No. 11/167,512, filed on Jun. 27, 2005, titled "COMPOUND WITH INDOLOCARBAZOLE MOIETIES AND DEVICES CONTAINING SUCH COMPOUND" is a continuation-in-part application of Beng S. Ong et al., U.S. application Ser. No. 11/011,678, filed on Dec. 14, 2004, from which priority is claimed, the disclosure of which is totally incorporated herein by reference.

Yuning Li et al., U.S. application Ser. No. 11/011,901, filed on Dec. 14, 2004, titled "PROCESS TO FORM COMPOUND WITH INDOLOCARBAZOLE MOIETIES."

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

BACKGROUND OF THE INVENTION

Organic thin-film transistors (OTFTs) have attracted much attention in recent years as a low-cost alternative to amorphous silicon transistors for electronic applications. OTFTs are particularly suited for applications where large-area circuits (e.g., backplane electronics for large displays), desirable form factors and structural features (e.g., flexibility for e-paper), and affordability (e.g., ultra low cost for ubiquitous RFID tags) are essential. The key component of OTFTs is the semiconductor materials. Therefore, there is enormous interest in the development of new organic semiconductors for OTFY applications.

Organic semiconductors are typically based on: (1) acenes such as tetracene, pentacene and their derivatives, (2) thiophenes such as oligothiophenes and polythiophenes, (3) fused-ring thiophene-aromatics and thiophene-vinylene/arylene derivatives. Most of these semiconductors are either insoluble or are sensitive to air, and may therefore not be suitable for low-cost OTFT applications. Therefore, there is a need addressed by embodiments of the present invention to develop new organic semiconductor compounds that can be processed in air for manufacturing low-cost OTFTs.

Moreover, it is desirable that the charge carrier mobility of OTFTs approach that of the amorphous silicon transistor. There is therefore a need addressed by embodiments of the present invention to provide sufficiently high charge carrier mobility for OTFTs.

The following documents provide background information:

Christos D. Dimitrakopoulos et al., "Organic Thin Film Transistors for Large Area Electronics," *Adv. Mater.*, Vol. 14, No. 2, pp. 99-117 (2002).

Salem Wakim et al., "Organic Microelectronics: Design, Synthesis, and Characterization of 6,12-Dimethylindolo[3,2-b]Carbazoles," *Chem. Mater.* Vol. 16, No. 23, pp. 4386-4388 (published on web Jul. 7, 2004).

Nan-Xing Hu et al., "5-11-Dihydro-5,11-di-1-naphthylindolo[3,2-b]carbazole: Atropisomerism in a Novel Hole-Transport Molecule for Organic Light-Emitting Diodes," *J. Am. Chem. Soc.*, Vol. 121, pp. 5097-5098 (1999).

Hu et al., U.S. Pat. No. 5,942,340.
Hu et al., U.S. Pat. No. 5,952,115.
Hu et al., U.S. Pat. No. 5,843,607.

SUMMARY OF THE DISCLOSURE

In embodiments, there is provided a substituted indolocarbazole comprising at least one optionally substituted thienyl.

In additional embodiments, there is provided an electronic device comprising a substituted indolocarbazole comprising at least one optionally substituted thienyl.

In embodiments, there is provided a thin film transistor comprising:

(a) a gate dielectric layer;
(b) a gate electrode;
(c) a semiconductor layer including an optionally substituted indolocarbazole;
(d) a source electrode; and
(e) a drain electrode, wherein the gate dielectric layer, the gate electrode, the semiconductor layer, the source electrode, and the drain electrode are in any sequence as long as the gate electrode and the semiconductor layer both contact the gate dielectric layer, and the source electrode and the drain electrode both contact the semiconductor layer.

In further embodiments, there is provided a thin film transistor comprising:

(a) a gate dielectric layer;
(b) a gate electrode;
(c) a semiconductor layer;
(d) a source electrode; and
(e) a drain electrode, wherein the gate dielectric layer, the gate electrode, the semiconductor layer, the source electrode, and the drain electrode are in any sequence as long as the gate electrode and the semiconductor layer both contact the gate dielectric layer, and the source electrode and the drain electrode both contact the semiconductor layer, and wherein the semiconductor layer includes an indolocarbazole selected from the group consisting of structures (A), (B), (C), (D), (E), (F), and (G), or a mixture thereof:

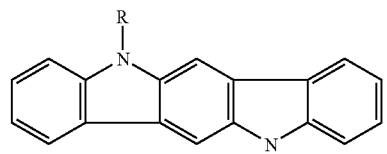

(A)

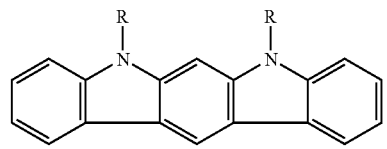

(B)

-continued

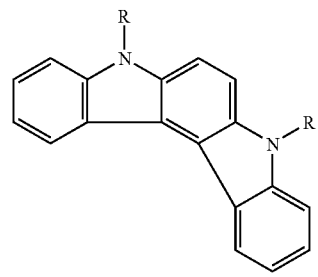
(C)

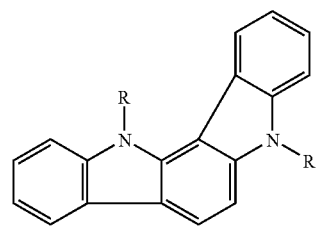
(D)

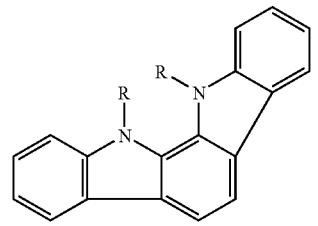
(E)

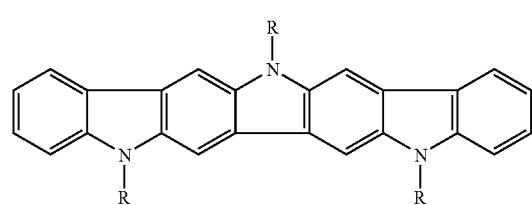
(F)

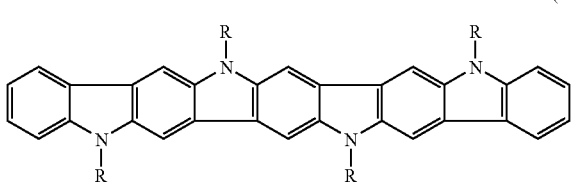
(G)

wherein for each of the structures (A) through (G), each R is independently selected from a group consisting of a hydrogen, a hydrocarbon group and a heteroatom-containing group, wherein each of the structures (A) through (G) is optionally peripherally substituted.

BRIEF DESCRIPTION OF THE DRAWINGS

Other aspects of the present invention will become apparent as the following description proceeds and upon reference to the following figures which represent exemplary embodiments.

Unless otherwise noted, the same reference numeral in different Figures refers to the same or similar feature.

DETAILED DESCRIPTION

Figure 1:
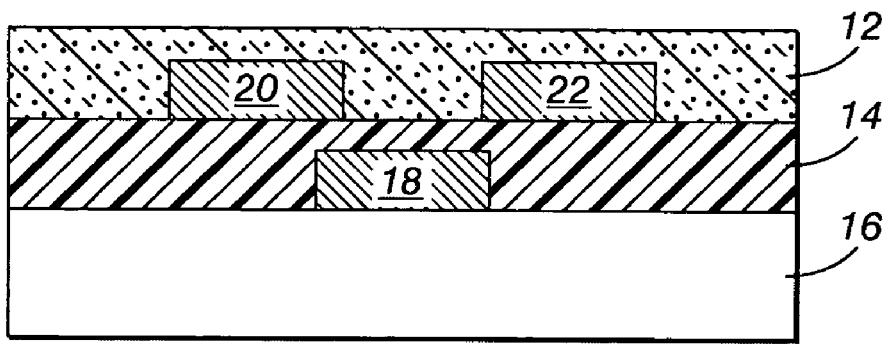
FIG. 1 represents a first embodiment of the present invention in the form of an OTFT.

The term "indolocarbazole" refers to a structure composed of one carbazole moiety (optionally substituted) and one, two or more indolo moieties (each optionally substituted), wherein the carbazole moiety is fused with one or more of the indolo moieties, and any adjacent indolo moieties are fused together. The fusing of the carbazole moiety with the one or more indolo moieties, and the fusing of adjacent indolo moieties can occur at any available positions. The carbazole moiety may be positioned at any suitable position in the structure such as at the end or the middle of the structure.

The optionally substituted indolocarbazole (a single compound or a mixture of two or more indolocarbazoles, each independently optionally substituted) may be used for any suitable applications, particularly as a semiconductor for electronic devices. The phrase "electronic devices" refers to macro-, micro- and/or nano-electronic devices such as thin film transistors, organic light emitting diodes, RFID tags, photovoltaic, and other electronic devices. In embodiments, the electronic device comprises a substituted indolocarbazole comprising at least one optionally substituted thienyl.

In embodiments, the indolocarbazole is unsubstituted or substituted with one or more substituents in any suitable substitution pattern. For substituted embodiments of the indolocarbazole, the substitution can be for example the following: (1) one or more nitrogen substitutions with no peripheral substitution; (2) one or more peripheral substitutions with no nitrogen substitution; or (3) one or more nitrogen substitutions and one or more peripheral substitutions. In embodiments, all the nitrogen atoms of the indolocarbazole are substituted with the same or different substituents, with the indolocarbazole being optionally peripherally substituted. In embodiments, the indolocarbazole is nitrogen substituted (and optionally peripherally substituted) wherein the one or more nitrogen substituents are independently selected from the group consisting of a hydrocarbon group and a heteroatom-containing group, or a mixture thereof. In embodiments, the indolocarbazole is peripherally substituted (and optionally nitrogen substituted) wherein the one or more peripheral substituents are independently selected from the group consisting of a hydrocarbon group, a heteroatom-containing group, and a halogen, or a mixture thereof.

In embodiments, the indolocarbazole is independently selected from the group consisting of structures (A), (B), (C), (D), (E), (F), and (G), or a mixture thereof:

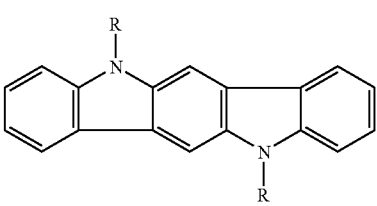
(A)

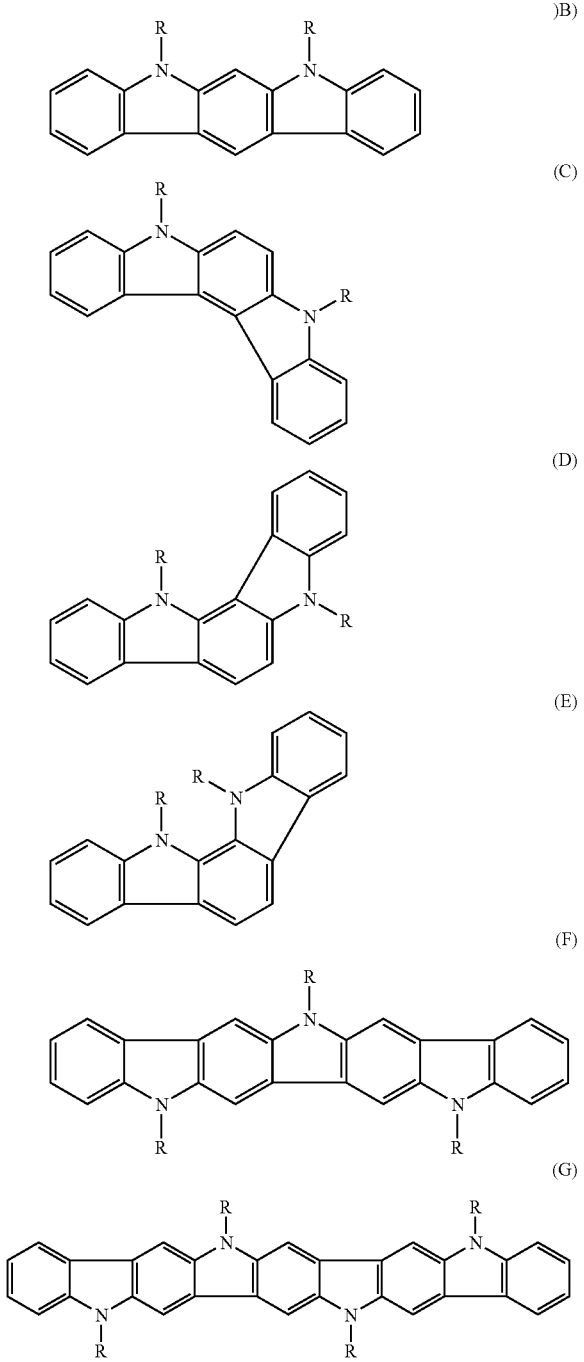

wherein for each of the structures (A) through (G), each R is independently selected from a group consisting of a hydrogen, a hydrocarbon group and a heteroatom-containing group (that is, each nitrogen atom can have the same or different R), wherein each of the structures (A) through (G) is optionally peripherally substituted by one or more substituents selected from the group consisting of a hydrocarbon group, a heteroatom-containing group, and a halogen, or a mixture thereof.

The phrases "peripherally substituted" and "peripheral substitution" refer to at least one substitution (by the same or different substituents) on any one or more aromatic rings of the indolocarbazole regardless whether the aromatic ring is a terminal aromatic ring or an internal aromatic ring (that is, other than at a terminal position).

The hydrocarbon group for the optionally substituted indolocarbazole contains for example from 1 to about 50 carbon atoms, or from 1 to about 30 carbon atoms, and may be for example a straight chain alkyl group, a branched alkyl group, a cyclic aliphatic group, an aryl group, an alkylaryl group, and an arylalkyl group. Exemplary hydrocarbon groups include for example methyl, ethyl, propyl, butyl, pentyl, hexyl, heptyl, octyl, nonyl, decyl, undecyl, dodecyl, tridecyl, tetradecyl, pentadecyl, cyclopentyl, cyclohexyl, cycloheptyl, and isomers thereof.

The heteroatom-containing group for the optionally substituted indolocarbazole has for example 2 to about 200 atoms, or from 2 to about 100 atoms and may be for example a nitrogen containing group, an alkoxy group, a heterocyclic system, an alkoxyaryl, an arylalkoxy, and a halogenated hydrocarbon (where the halogen is for example fluorine, bromine, chlorine, or iodine, or a mixture thereof). Exemplary heteroatom-containing groups include for example fluoroalkyl, fluoroaryl, cyano, nitro, carbonyl, carboxylate, amino (optionally substituted with one or two substituents such as for example a hydrocarbon group described herein), and alkoxy (having for example 1 to about 18 carbon atoms). In embodiments, the heteroatom-containing group is independently selected from fluoroalkyl (having for example 1 to about 18 carbon atoms), fluoroaryl, alkoxy (having for example 1 to about 18 carbon atoms), carbonyl, carboxylate, amino (optionally substituted with one or two substituents such as for example a hydrocarbon group described herein), nitro, and cyano, or a mixture thereof. In embodiments, the heteroatom-containing group is an optionally substituted carbazole group.

In embodiments, the heteroatom-containing group is an optionally substituted thienyl comprising one, two, or more thienyl units, each thienyl unit being the same or different from each other and of exemplary structure (A)

where $R_1$ is independently selected from a hydrocarbon group (such as those described herein for the optionally substituted indolocarbazole), a heteroatom containing group (such as those described herein for the optionally substituted indolocarbazole), and a halogen (such as those described herein for the optionally substituted indolocarbazole), and where m is 0, 1, 2 or 3.

In embodiments, $R_1$ is part of a cyclic ring structure fused to the thienyl unit, where the fused cyclic ring structure is of any size such as for example a 4 to 8 membered ring, particularly, a 5 or 6 membered ring, wherein $R_1$ is attached at the carbon atoms at for example the third ring position and the fourth ring position of the thienyl unit, or any other available ring positions. The fused ring structure (containing $R_1$) may be either a hydrocarbon group described herein or a heteroatom containing group described herein. Where $R_1$ is part of a ring structure fused to a thienyl unit, m is 1 even though $R_1$ in this situation is bonded to two positions of the thienyl unit. Examples of the thienyl unit with $R_1$ being part of a ring substituent structure are the following:

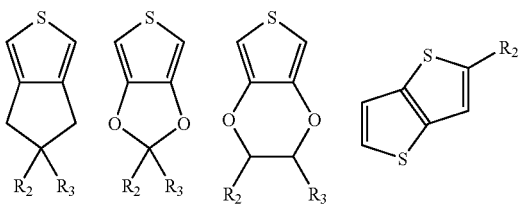

wherein $R_2$ and $R_3$ are the same or different from each other, and are selected from the group consisting of:

(a) a hydrocarbon group (such as those described herein for the optionally substituted indolocarbazole), (b) a heteroatom containing group (such as those described herein for the optionally substituted indolocarbazole), (c) a halogen (such as those described herein for the optionally substituted indolocarbazole), and (d) a hydrogen.

The halogen for the optionally substituted indolocarbazole is fluorine, bromine, chlorine, or iodine, or a mixture thereof.

The number of the indolo moiety in the optionally substituted indolocarbazole is for example from 1 to 4, or from 1 to 2.

To be an efficient semiconductor for OTFTs, the optionally substituted indolocarbazole in embodiments provides (i) proper molecular ordering conducive to charge carrier transport; and (ii) sufficient stabilization to charge carriers to enable efficient charge carrier injection. In embodiments, the indolocarbazole has one or more strategically placed substituents comprising for example at least one long chain alkyl group (having for example about 6 to about 18 carbon atoms in length) to promote molecular self-assembly, thus forming proper molecular ordering for charge carrier transport. In embodiments, the indolocarbazole also has one or more strategically placed substituents such as for example aryl substituents at the nitrogen positions to provide resonance-stabilization to injected charge carriers. In embodiments, to provide resonance-stabilization to injected charge carriers, the indolocarbazole is substituted with one or more substituents independently selected from the group consisting of a long chain alkyl group (having for example about 6 to about 18 carbon atoms in length), an alkylphenyl (the alkyl of the alkylphenyl having for example about 6 to about 18 carbon atoms in length), a phenyl, a chloro, an alkoxy (having for example 1 to about 18 carbon atoms), and an amino (optionally substituted with one or two substituents such as for example a hydrocarbon group described herein), or a mixture thereof.

The indolocarbazole may be a p-type semiconductor or n-type semiconductor, depending very much on the nature of the substituents. Substituents which possess an electron donating property such as alkyl, alkoxy and aryl groups, when present in the indolocarbazole, render the indolocarbazole a p-type semiconductor. On the other hand, substituents which are electron withdrawing such as cyano, nitro, fluorinated alkyl, and fluorinated aryl groups may transform the indolocarbazole into the n-type semiconductor.

In embodiments, the optionally substituted indolocarbazole has a band gap of for example greater than about 1.8 eV, greater than about 2.0 eV, or greater than about 2.5 eV. The corresponding highest occupied molecular orbital (HOMO) energy level of the optionally substituted indolocarbazole is for example lower than about 4.9 eV from vacuum, preferably lower than about 5.1 eV from vacuum. The optionally substituted indolocarbazoles are in embodiments relatively stable against oxygen doping in air by virtue of their relatively low lying HOMOs.

In embodiments, the relatively low-lying HOMOs and large band gaps of the optionally substituted indolocarbazole generally provides many advantages over other semiconductors. For example, in embodiments, the optionally substituted indolocarbazoles generally have no or little absorbance in the visible region of the spectrum, and are therefore expected to be photochemically stable when exposed to light.

Illustrative examples of the optionally substituted indolocarbazole which may be suitable for OTFT applications are shown in the following:

(1)

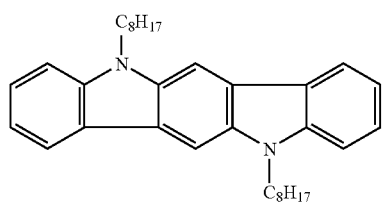

(2)

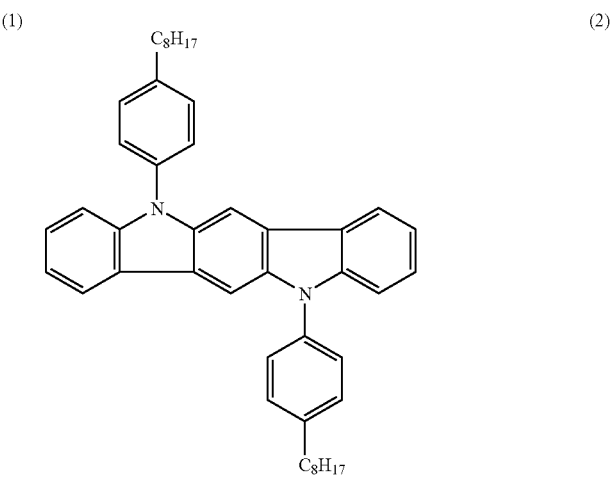

-continued
(3)
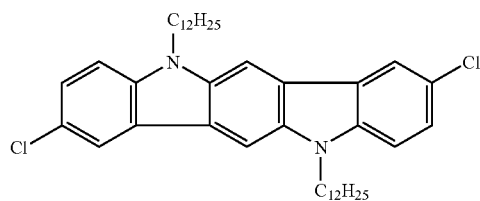
(4)
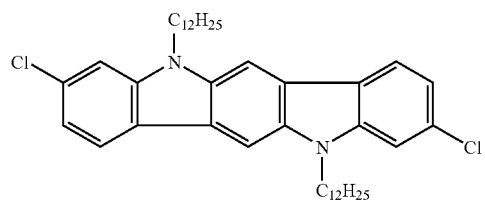
(5)
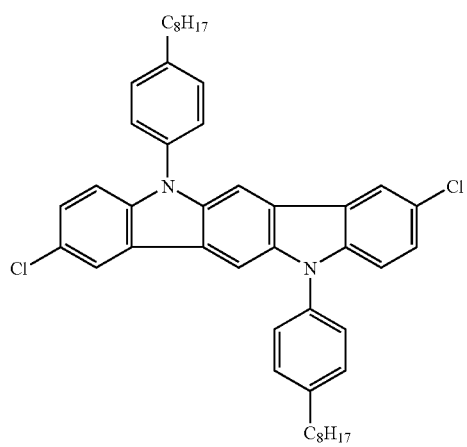
(6)
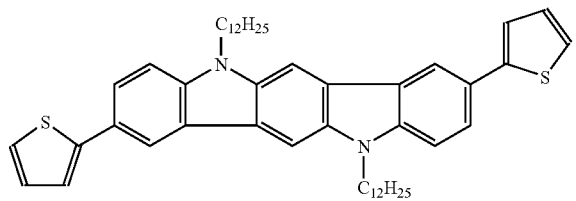
(7)
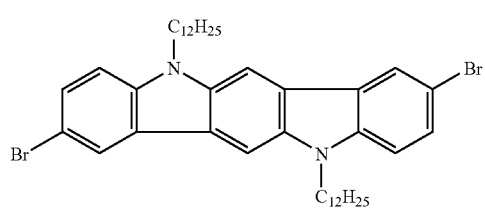
(8)
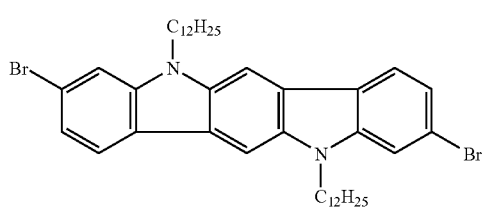
(9)
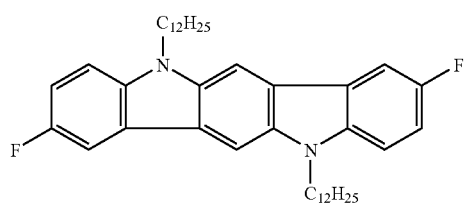
(10)
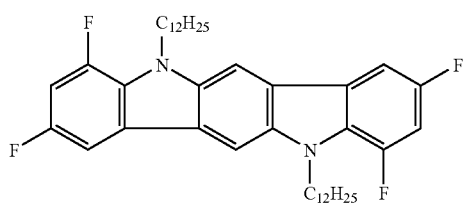
(11)
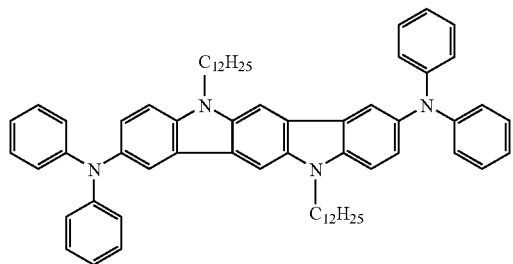
(12)
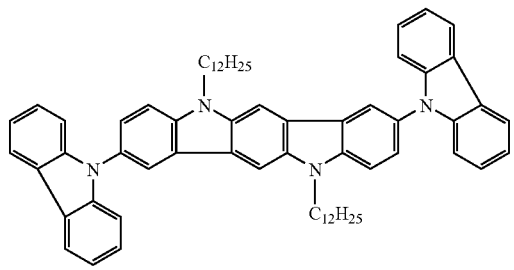

-continued
(13)
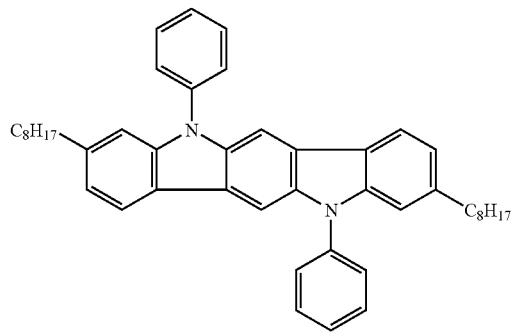
(14)
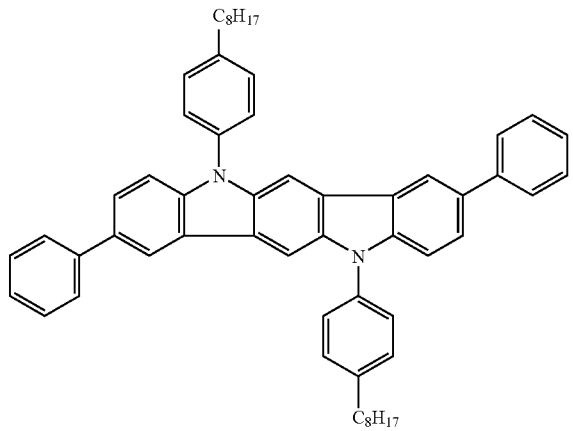
(15)
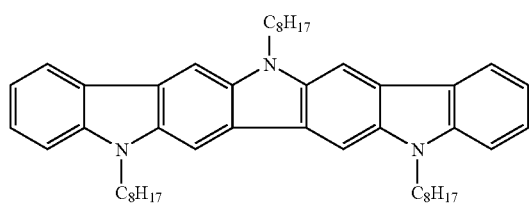
(16)
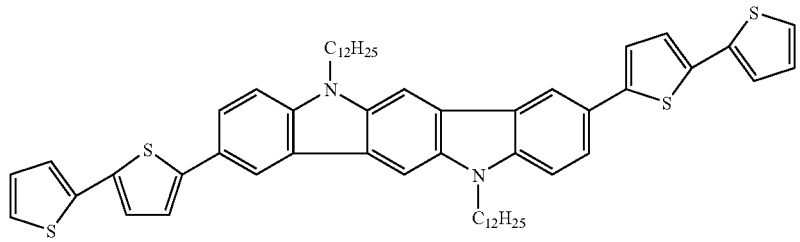
(17)
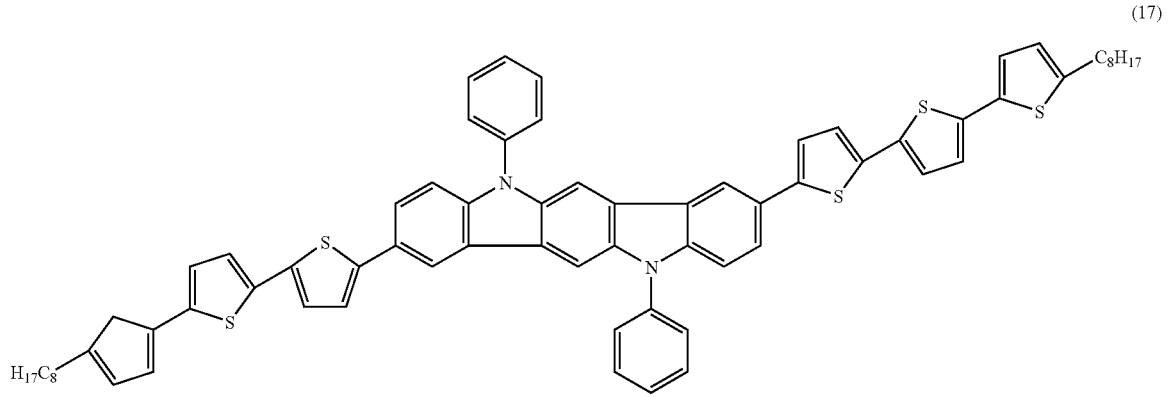
(18)
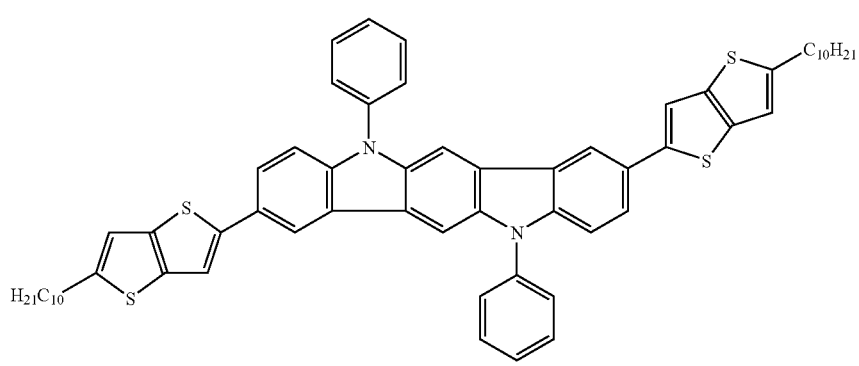

Any suitable methods can be used to prepare the optionally substituted indolocarbazole. For example, indolocarbazoles of compound (1) and compound (2) can be prepared as follows. The 5,11-dihydridoindolo[3,2-b]carbazole could be first prepared by double Fischer indolization starting from phenylhydrazine and 1,4-cyclohexanedione according to the method described in B. Robinson, *J. Chem. Soc.* 1963, pp. 3097-3099, the disclosure of which is totally incorporated herein by reference. The 5,11-dialkylindolo[3,2-b]carbazole, such as compound (1), was readily prepared by phase-transfer condensation of 5,11-dihydridoindolo[3,2-b]carbazole with alkylbromide and aqueous NaOH in dimethyl sulfoxide ("DMSO") in the presence of a phase transfer catalyst, benzyltriethylammonium chloride. On the other hand, 5,11-diarylindolo[3,2-b]carbazole, such as compound (2), was obtained by Ullmann condensation of 5,11-dihydridoindolo [3,2-b]carbazole with aryliodide using excess copper and a catalytic amount of 18-crown-6 in refluxing 1,2-dichlorobenzene.

Any suitable fabrication techniques may be used to form the semiconductor layer including the optionally substituted indolocarbazole for OTFTs. One such method is by vacuum evaporation at a vacuum pressure of about $10^{-5}$ to $10^{-7}$ torr in a chamber containing a substrate and a source vessel that holds the optionally substituted indolocarbazoles. The vessel is heated until the compound sublimes and deposits on the substrate. In embodiment, the substrate may be held at room temperature or at an elevated temperature of for example 50° C., 70° C., or 120° C. Solution deposition techniques, in embodiments, may also be used to fabricate the semiconductor layer including the optionally substituted indolocarbazole. Solution deposition techniques refer to spin coating, blade coating, rod coating, screen printing, ink jet printing, stamping and the like. As an example of liquid deposition, the optionally substituted indolocarbazole is first dissolved in a suitable solvent of for example tetrahydrofuran, dichloromethane, chlorobenzene, dichlorobenzene, toluene, and xylene to form a solution with a concentration of about 0.1% to 30%, particularly about 0.3% to 10% by weight. The solution is then used to form a semiconductor layer on a suitable substrate via spin coating at a speed of about 500 to about 3000 rpm, particularly about 1000 to about 2000 rpm for a period of time of about 5 to about 180 seconds, particularly about 30 to about 60 seconds at room temperature or an elevated temperature.

The semiconductor layer may be predominantly amorphous or predominantly crystalline in nature, depending on the indolocarbazole and processing conditions. The semiconductor layer can be characterized by common characterization techniques such as X-ray diffraction, atomic force microscopy, optical microscopy, etc. For example, a predominantly amorphous layer usually shows broad X-ray diffraction peaks, while a predominantly crystalline layer generally exhibits sharp X-ray diffraction peaks. The degree of crystallinity of a semiconductor layer can be calculated from the integrated area of diffraction peaks. In embodiments, the phrase "predominately crystalline" indicates that the crystallinity of the semiconductor layer is for example larger than about 50%, larger than about 80%, or larger than about 90%.

Depending on the nature of the optionally substituted indolocarbazole, a predominantly crystalline semiconductor layer can be formed by a number of techniques. For example, a predominantly crystalline semiconductor layer can be formed by vacuum evaporation of the indolocarbazole onto a substrate holding at an elevated temperature of for example about 50° C. to about 120° C. In another technique, a predominantly crystalline semiconductor layer can be achieved by solution coating followed by controlled solvent evaporation and optionally post-deposition annealing at an elevated temperature of for example about 80° C. to about 250° C.

In FIG. 1, there is schematically illustrated an OTFT configuration 10 comprised of a substrate 16, in contact therewith a metal contact 18 (gate electrode) and a gate dielectric layer 14 on top of which two metal contacts, source electrode 20 and drain electrode 22, are deposited. Over and between the metal contacts 20 and 22 is an organic semiconductor layer 12 as illustrated herein.

Figure 2:
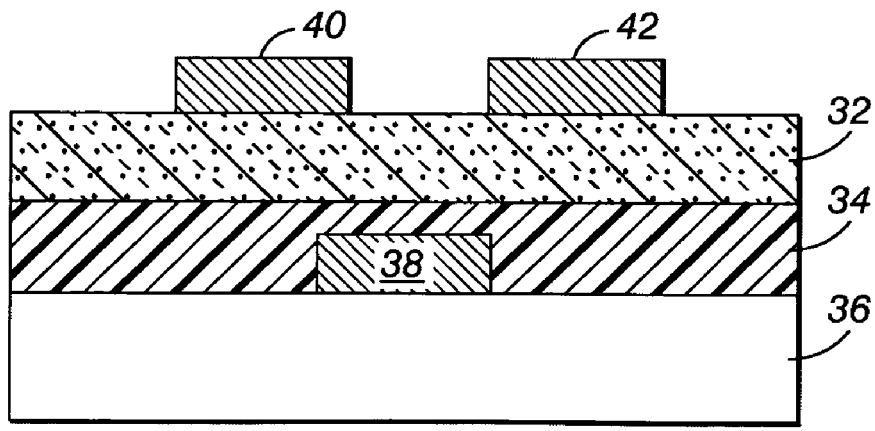
FIG. 2 represents a second embodiment of the present invention in the form of an OTFT.

FIG. 2 schematically illustrates another OTFT configuration 30 comprised of a substrate 36, a gate electrode 38, a source electrode 40 and a drain electrode 42, a gate dielectric layer 34, and an organic semiconductor layer 32.

Figure 3:
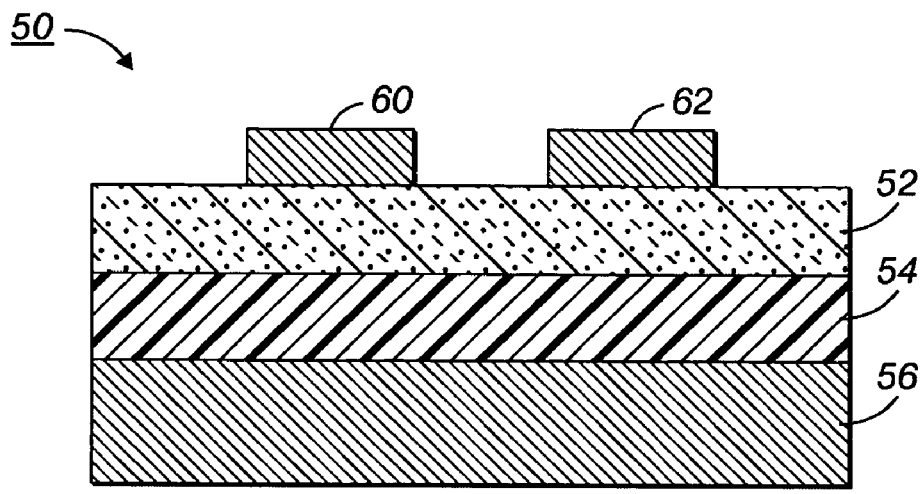
FIG. 3 represents a third embodiment of the present invention in the form of an OTFT.

FIG. 3 schematically illustrates a further OTFT configuration 50 comprised of a heavily n-doped silicon wafer 56 which acts as both a substrate and a gate electrode, a thermally grown silicon oxide gate dielectric layer 54, and an organic semiconductor layer 52, on top of which are deposited a source electrode 60 and a drain electrode 62.

Figure 4:
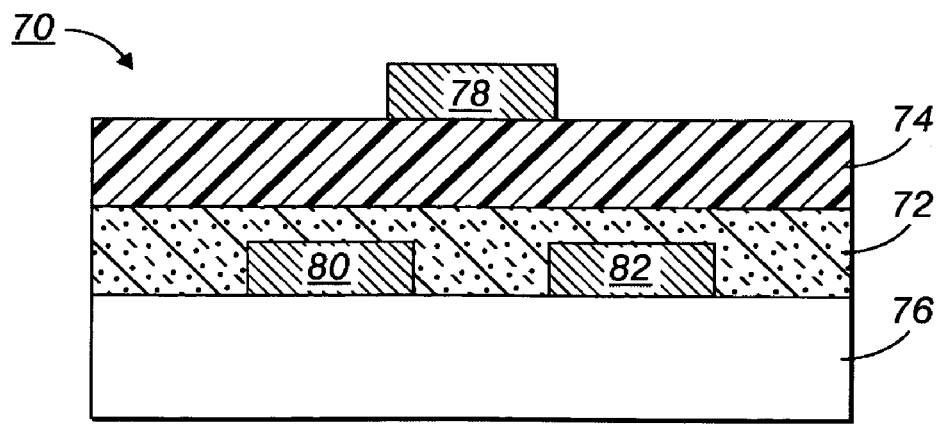
FIG. 4 represents a fourth embodiment of the present invention in the form of OTFT.

FIG. 4 schematically illustrates an additional OTFT configuration 70 comprised of substrate 76, a gate electrode 78, a source electrode 80, a drain electrode 82, an organic semiconductor layer 72, and a gate dielectric layer 74.

The composition and formation of the semiconductor layer are described herein.

The semiconductor layer has a thickness ranging for example from about 10 nanometers to about 5 micrometer with a preferred thickness of from about 20 to about 500 nanometers. The OTFT devices contain a semiconductor channel with a width W and length L. The semiconductor channel width may be, for example, from about 1 micrometer to about 5 millimeters, with a specific channel width being about 5 micrometers to about 1 millimeter. The semiconductor channel length may be, for example, from about 500 nanometers to about 1 millimeter with a more specific channel length being from about 1 micrometer to about 100 micrometers.

The substrate may be for instance a silicon wafer, glass plate, plastic film or sheet. For structurally flexible devices, a plastic substrate such as for example polyester, polycarbonate, or polyimide sheet and the like may be preferred. The thickness of the substrate may be from about 10 micrometers to over about 10 millimeters with an exemplary thickness being from about 50 to about 100 micrometers, especially for a flexible plastic substrate and from about 1 to about 10 millimeters for a rigid substrate such as glass or silicon.

The gate electrode can be a thin metal film, a conducting polymer film, a conducting film made from conducting ink or paste, or the substrate itself can be the gate electrode, for example heavily doped silicon wafer. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors. The source and drain electrode layers can be fabricated from materials which provide a low resistance ohmic contact to the semiconductor layer. Typical materials suitable for use as source and drain electrodes include those of the gate electrode materials such as gold, silver, nickel, aluminum, platinum, conducting polymers and conducting inks. Typical thicknesses of source and drain electrodes are about, for example, from about 40 nanometers to about 10 micrometers with the more specific thickness being about 100 to about 400 nanometers.

The gate dielectric layer can be composed of inorganic materials, organic materials, or organic-inorganic hybrid materials. Illustrative examples of inorganic materials suitable as the gate dielectric layer include silicon oxide, silicon nitride, aluminum oxide, barium titanate, barium zirconium titanate and the like; illustrative examples of organic materials for the gate dielectric layer include polyesters, polycarbonates, poly(vinyl phenol), polyimides, polystyrene, poly (methacrylate)s, poly(acrylate)s, epoxy resin and the like. The thickness of the gate dielectric layer is, for example from about 10 nanometers to about 500 nanometers depending on the dielectric constant of the dielectric material used. An exemplary thickness of the gate dielectric layer is from about 100 nanometers to about 500 nanometers. The gate dielectric layer may have a conductivity of for example less than about $10^{-12}$ S/cm.

In embodiments, the gate dielectric layer layer, the gate electrode, the semiconductor layer, the source electrode, and the drain electrode are formed in any sequence with the gate electrode and the semiconductor layer both contact the gate dielectric layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of OTFTs are described in Bao et al., U.S. Pat. No. 6,107,117, the disclosure of which is totally incorporated herein by reference.

The source electrode is grounded and a bias voltage of generally, for example for p-channel OTFTs, about 0 volt to about −80 volts is applied to the drain electrode to collect the charge carriers transported across the semiconductor channel when a voltage of generally about +20 volts to about −80 volts is applied to the gate electrode.

In embodiments, the semiconductor layer of the present invention when used in OTFTs has a field-effect mobility of greater than for example about $10^{-3}$ cm$^2$ Vs, preferably greater than for example about $10^{-2}$ cm$^2$ Vs. OTFTs produced by the present process have an on/off ratio of greater than for example about $10^3$. On/off ratio refers to the ratio of the source-drain current when the transistor is on to the source-drain current when the transistor is off.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated. As used herein, room temperature refers to a temperature ranging for example from about 20 to about 25° C.

EXAMPLE 1

(a) Synthesis of 5,11-Dioctylindolo[3,2-b] carbazole (1)

5,11-Dihydridoindolo[3,2-b]carbazole was synthesized by double Fischer indolization starting from phenylhydrazine and 1,4-cyclohexanedione according to the method described in B. Robinson, *J. Chem. Soc.* 1963, 3097-3099.

A freshly prepared 50% aqueous NaOH solution (4 mL) was added to a well-stirred mixture of 5,11-dihydridoindolo [3,2-b]carbazole, (0.513 g, 2 mmol), benzyltriethylammonium chloride (0.09 g, 0.4 mmol), 1-bromooctane (1.55 g, 8 mmol), and DMSO (20 mL) in a 100-mL flask under an argon atmosphere. The mixture was stirred at room temperature for 2.5 h and then heated to 65° C. and maintained at this temperature for 4 h. Subsequently the reaction mixture was cooled down to room temperature and poured into 200 mL methanol with stirring. The precipitated yellow solid was filtered off and washed with water, and 3 times each with N,N-dimethylformamide, methanol, and acetone. The yellow solid was purified by column chromatography on silica gel using hexane as eluent. Recrystallization from hexane yielded 0.867 g (90.1 %) of 5,11-dioctylindolo[3,2-b]carbazole, (1), which was subject to train sublimation to obtain electrically pure material for OTFT fabrication. DSC showed two endotherms at 84° C. and 101° C. on heating. $^1$H NMR (CDCl$_3$): δ 8.21 (d, J=7.6 Hz, 2H), 8.01 (s, 2H), 7.47 (dd, J$_1$=7.0 Hz, J$_2$=0.9 Hz, 2H), 7.41 (d, J=7.6 Hz, 2H), 7.21 (dd, J$_1$=7.0 Hz, J$_2$=0.9 Hz, 2H), 4.40 (t, J=7.3 Hz, 4H), 1.95 (pent, J=7.3 Hz, 4H), 1.25-1.50 (m, 20H), 0.86 (m, 6H); IR (NaCl): 3050, 2952, 2921, 2852, 1510, 1469, 1482, 1326, 737 cm$^{-1}$.

(b) OTFT Device Fabrication and Evaluation

A top-contact thin film transistor configuration as schematically illustrated, for example, in FIG. 3 was selected as our test device structure. The test device was built on a n-doped silicon wafer with a thermally grown silicon oxide layer with a thickness of about 110 nanometers thereon, and had a capacitance of about 30 nF/cm$^2$ (nanofarads per square centimeter), as measured with a capacitor meter. The wafer functioned as the gate electrode while the silicon oxide layer acted as the gate dielectric. The silicon wafer was first cleaned with isopropanol, argon plasma, isopropanol and air dried, and then immersed in a 0.1 M solution of octyltrichlorosilane (OTS-8) in toluene at 60° C. for 20 min. Subsequently, the wafer was washed with toluene, isopropanol and air-dried. A 100-nm thick semiconductor layer of indolocarbazole (1) was deposited on the OTS-8-treated silicon wafer substrate by vacuum evaporation at a rate of 2 Å/s under a high vacuum of 10$^{-6}$ torr with the substrate held at room temperature. Thereafter, the gold source and drain electrodes of about 50 nanometers were deposited on top of the semiconductor layer by vacuum deposition through a shadow mask with various channel lengths and widths, thus creating a series of transistors of various dimensions.

The predominately crystalline nature of vacuum evaporated thin film of indolocarbazole (1) was confirmed by X-ray diffraction measurement. Sharp diffraction peak in their X-ray diffraction patterns was observed at 2θ=5.24° with the second and third diffraction peaks at 2θ=10.480° and 15.800°, corresponding to an interlayer distance of 16.85 Å.

The performance of the OTFT devices with semiconductor indolocarbazole (1) was characterized using a Keithley 4200 SCS semiconductor characterization system in a black box (that is, a closed box which excluded ambient light) at ambient conditions. The field-effect mobility, μ, was calculated from the data in the saturated regime (gate voltage, V$_G$<source-drain voltage, V$_{SD}$) according to equation (1)

$$I_{SD}=C_i\mu(W/2L)(V_G-V_T)^2 \qquad (1)$$

where I$_{SD}$ is the drain current at the saturated regime, W and L are, respectively, the semiconductor channel width and length, Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}=0$.

The transfer and output characteristics of the devices showed that indolocarbazole (1) is a p-type semiconductor. Using transistors with a dimension of W=5,000 μm and L=90 μm, the following average properties from at least five transistors were obtained:

Mobility: $1.3-3.0\times10^{-3}$ $cm^2/Vs$
On/off ratio: $10^4-10^5$.

EXAMPLE 2

(a) 5,11-Bis(4-octylphenyl)indolo[3,2-b] carbazole (2)

1-Iodo-4-octylbenzene was first prepared as follows. A mixture of 1-phenyloctane (14.87 g, 78.13 mmol), iodine (7.93 g, 31.25 mmol), $H_5IO_6$ (3.56 g, 15.63 mmol), acetic acid (40 mL), deionized water (7 mL), and 98% sulfuric acid (2.59 g) in a 100 mL flask was heated at 80° C. for about 3 h until the purple iodine color disappeared. The reaction mixture was extracted with dichloromethane, neutralized with saturated aqueous $NaHCO_3$, and washed three times with water. The organic layer was separated, dried over $MgSO_4$, filtered, and the solvent was removed using a rotary evaporator. After column chromatography on silica gel using hexane, 22.53 g of a colorless viscous liquid was obtained; $^1$H NMR indicated that the crude product was a mixture of 1-iodo-4-octylbenzene (69%), 1-iodo-2-octylbenzene (24%), and unreacted 1-phenyloctane (7%). This crude product was used in subsequent preparation of 5,11-bis(4-octylphenyl)indolo [3,2-b]carbazole, compound (2), without complications. $^1$H NMR data for 1-iodo-4-octylbenzene ($CDCl_3$): δ 7.54 (d, J=8.2 Hz, 2H), 6.92 (d, J=8.2 Hz, 2H), 2.53 (t, J=7.7 Hz, 2H), 1.55 (m, 2H), 1.20-1.40 (m, 10H), 0.88(t, J=6.9 Hz, 3H).

A mixture of 1-iodo-4-octylbenzene (16.09 g, 35.1 mmol, 69% of purity) as prepared above, 5,11-dihydridoindolo[3,2-b]carbazole (3.00 g, 11.7 mmol), 18-crown-6 (0.62 g, 2.34 mmol), $K_2CO_3$ (12.94 g, 93.6 mmol), copper (2.97 g, 46.8 mmol), and 1,2-dichlorobenzene (50 mL) was charged into an argon-filled 200 mL flask fitted with a condenser. The mixture was heated under reflux in an argon atmosphere for 24 h. Subsequently, the reaction mixture was cooled down to room temperature, diluted with tetrahydrofuran, and filtered. A viscous liquid, obtained after removal of solvent on a rotary evaporator, was added to 400 mL of methanol with vigorous stirring. The precipitated yellow solid was filtered, washed several times with water and methanol, dissolved in 400 mL of hexane by heating, and filtered to remove the insoluble impurities. The filtrate was concentrated to about 50 mL and allowed to cool down to room temperature, and then chilled at 0° C. overnight. The crystallized yellow product was filtered, washed with a small amount of hexane, and dried to yield 5.32 g of 5,11-bis(4-octylphenyl)indolo[3,2-b]carbazole, compound (2), which was subject to train sublimation to obtain electrically pure compound for OTFT fabrication. DSC showed a melting point at 131° C. on first heating. $^1$H NMR ($CDCl_3$): δ 8.12 (d, J=7.6 Hz, 2H), 8.05 (s, 2H), 7.58 (d, J=8.3 Hz, 4H), 7.47 (d, J=8.3 Hz, 4H), 7.39-7.40 (m, 4H), 7.19-7.21 (m, 2H), 2.78 (t, J=7.8 Hz, 4H), 1.78 (pent, J=7.4 Hz, 4H), 1.30-1.50 (m, 20H), 0.92 (m, 6H); IR (NaCl): 3047, 2956, 2923, 2852, 1517, 1451, 1324, 1236, 842, 731 $cm^{-1}$.

(b) OTFT Device Fabrication and Evaluation

The fabrication and characterization of compound (2) as a semiconductor for OTFTs were carried out in accordance with the procedures of Example 1. During vacuum deposition of compound (2), the silicon wafer substrate was held at room temperature as well as at 50° C.

The vacuum evaporated thin film of compound (2) with the substrate temperature of 50° C. showed predominately crystalline characteristics as revealed by X-ray diffraction measurement. Sharp diffraction peak in its X-ray diffraction pattern was observed at 2θ=3.620° with the third and fifth diffraction peaks at 2θ=10.91° and 18.09°, corresponding to an interlayer distance of 24.41 Å.

The devices were evaluated in the same manner as in Example 1. Using transistors with a dimension of W=5,000 μm and L=90 μm, the following average properties from at least five transistors were obtained:

Devices fabricated with substrates held at room temperature:
Mobility: 0.01-0.02 $cm^2/Vs$
On/off ratio: $10^5-10^6$.
Devices fabricated with substrates held at 50° C:
Mobility: 0.07-0.12 $cm^2/Vs$
On/off ratio: $10^6-10^7$.

EXAMPLE 3

(a) Synthesis of 2,8-dichloro-5,11-didodecylindolo[3,2-b]carbazole (3)

To a well-stirred suspension of 4-chlorophenylhydrazine hydrochloride (24.5 g, 0.137 mol) in ethanol (200 mL) in a 500-mL flask was added a solution of sodium acetate trihydrate (56.34 g, 0.414 mol) in water (100 mL), and the resultant mixture was stirred for 15 min at room temperature. Subsequently, a solution of 1,4-cyclohexandione (7.67 g, 68.4 mmol) in ethanol (50 mL) was added, followed by addition of 50 mL of acetic acid. The reaction mixture was heated at 50° C. for 1 h before cooling down to 0° C. and maintained there for 1 h. The precipitated light yellow crude cyclohexane-1,4-dione bis[(4-chlorophenyl)hydrazone] was filtered, washed with water, air-dried, and added in small portions to a mixture of acetic acid (75 mL) and sulfuric acid (15 mL, 98%) in a 1-L flask with stirring at 10° C. over a period of 10 min, and then allowed to warm to 25° C. and stirred for 10 min. Subsequently, the mixture was heated to about 65° C. until reaction occurred, and further stirred at 65° C. for 15 min before cooling down to and stirred at room temperature overnight. The product was filtered, washed with methanol and water, and then stirred in 200 mL of boiling methanol for 30 minutes, filtered, and dried in vacuo at 50° C. for 5 h to give 4.26 g (22.8%) of 2,8-dichloroindolo[3,2-b]carbazole, which was pure enough for subsequent preparation of 2,8-dichloro-5,11-didodecylindolo[3,2-b]carbazole, compound (3).

$^1$H NMR (DMSO-d6): 11.34 (s, 2H), 8.33 (d, J=1.9 Hz, 2H), 8.21 (s, 2H), 7.46 (d, J=8.6 Hz, 2H), 7.38 (dd, $J_1$=8.6 Hz, $J_2$=1.9 Hz, 2H).

50% aqueous NaOH solution (4 mL) was added to a well-stirred mixture of 2,8-dichloroindolo[3,2-b]carbazole (0.65 g, 2 mmol), benzyltriethylammonium chloride (90 mg, 0.4 mmol), and 1-bromododecane (1.99 g, 8 mmol) in DMSO (20 mL) in a 100-mL flask, and the resultant mixture was stirred at room temperature for 1 h and then at 50° C. for 4 h. Subsequently, the mixture was poured into MeOH (200 mL), and the precipitated yellow solid was filtered and washed 3 times each with water, N,N-dimethylformamide, methanol, and acetone, yielding 1.16 g (88.0%) of 2,8-dichloro-5,11-didodecylindolo[3,2-b]carbazole, compound (3), after drying in vacuo. It was then subject to train sublimation to obtain electrically pure samples for OTFT fabrication.

$^1$H NMR (CDCl$_3$): δ 8.15 (d, J=1.9 Hz, 2H), 7.94 (s, 2H), 7.43 (dd, J$_1$=8.6 Hz, J$_2$=1.9 Hz, 2H), 7.32 (d, J=8.6 Hz, 2H), 4.38 (t, J=7.2 Hz, 4H), 1.92 (pent, J=7.2 Hz, 4H), 1.30-1.50 (m, 36 H), 0.87 (t, J=6.8 Hz, 6H). IR (NaCl): 2947, 2920, 2846, 1513, 1464, 1440, 1316, 1127, 1068, 847, 787, 726 cm$^{-1}$.

(b) OTFT Device Fabrication and Evaluation

The fabrication and characterization of compound (3) as a semiconductor for OTFT's were carried out in accordance with the procedures of Example 1. During vacuum deposition of compound (3), the silicon wafer substrate was held at three different temperatures: room temperature, 50° C., and 70° C.

The vacuum evaporated thin film of compound (3) with the substrate temperature of 70° C. showed predominately crystalline characteristics as revealed by X-ray diffraction measurement. Sharp diffraction peak in its X-ray diffraction pattern was observed at 2θ=4.14° with the second and third diffraction peaks at 2θ=8.280° and 12.42°, corresponding to an interlayer distance of 21.3 Å.

The devices were evaluated in the same manner as in Example 1. Using transistors with a dimension of W=5,000 μm and L=90 μm, the following average properties from at least five transistors were obtained:

Devices fabricated with substrates held at room temperature:
Mobility: 0.02-0.03 cm$^2$/Vs
On/off ratio: 10$^5$-10$^6$.
Devices fabricated with substrates held at 50° C.:
Mobility: 0.06-0.085 cm$^2$/Vs
On/off ratio: 10$^6$-10$^7$.
Devices fabricated with substrates held at 70° C.:
Mobility: 0.085-0.14 cm$^2$/Vs
On/off ratio: 10$^7$.

EXAMPLE 4

(a) 5,11-Bis(4-methylphenyl)indolo[3,2-b]carbazole

A mixture of 5,11-dihydridoindolo[3,2-b]carbazole (2.56 g, 10 mmol), 18-crown-6 (0.52 g, 2.0 mmol), K$_2$CO$_3$ (11.06 g, 80 mmol), 4-iodotoluene (6.54 g, 30 mmol), copper (2.54 g, 40 mmol), and 1,2-dichlorobenzene (40 mL) was charged into an argon-filled 200 mL flask fitted with a condenser. The mixture was heated under reflux in an argon atmosphere for 24 h. Subsequently, the reaction mixture was cooled down to room temperature, diluted with toluene, and filtered. The solid was stirred in 50 mL of N,N-dimethylformamide and 50 mL of 2N HCl was added dropwise and the mixture was stirred for 30 min. The yellow suspension was decanted and filtered to give a yellow solid. The solid was then stirred in a mixture of DMSO (200 mL) and 20% NaOH (50 mL) for 30 min and then filtered. The solid was washed with deionized water, methanol, and dried to yield 1.65 g of 5,11-bis(4-methylphenyl)indolo[3,2-b]carbazole, which was then subject to train sublimation to obtain electrically pure compound for OTFT fabrication. DSC showed two endotherms at 305° C. and 322° C. on first heating. $^1$H NMR (CDCl$_3$): δ 8.11 (d, J=7.8 Hz, 2H), 8.04 (s, 2H), 7.57 (d, J=8.3 Hz, 4H), 7.48 (d, J=8.3 Hz, 4H), 7.39 (d, J=3.7 Hz, 4H), 7.21 (m, 2H), 2.54 (s, 6H); IR (NaCl): 3034, 2916, 1606, 1515, 1451, 1323, 1235, 1191, 819, 741 cm$^{-1}$.

(b) Device Fabrication and Evaluation

The fabrication and characterization of 5,11-bis(4-methylphenyl)indolo[3,2-b]carbazole as a semiconductor for OTFTs were carried out in accordance with the procedures of Example 1. During vacuum deposition, the silicon wafer was held at three different temperatures: room temperature, 50° C. and 70° C.

X-ray diffraction measurements were done on the vacuum evaporated thin film of 5,11-bis(4-methylphenyl)indolo[3,2-b]carbazole with the substrate temperature of 70° C. Only featureless broad diffraction peaks were present in the XRD pattern, indicating its amorphous nature.

The devices were evaluated in the same manner as in Example 1 using transistors with a dimension of W=5,000 μm and L=90 μm. All devices with 5,11-bis(4-methylphenyl) indolo[3,2-b]carbazole semiconductor exhibited mobility of about 10$^{-5}$ cm$^2$/Vs regardless of the substrate temperature.

Embodiments of the present OTFT are illustrated in Examples 1 through 4. It is noted that the mobilities of the devices in Examples 1, 2, and 3 having a predominately crystalline semiconductor layer are higher than the mobility of the device in Example 4 having a predominately amorphous semiconductor layer. Other embodiments of the present OTFY (containing a predominately crystalline semiconductor layer or a predominately amorphous semiconductor layer) may provide similar or better performance.

The invention claimed is:

1. A thin film transistor comprising:
   (a) a gate dielectric layer;
   (b) a gate electrode;
   (c) a predominately crystalline semiconductor layer including an optionally substituted indolocarbazole;
   (d) a source electrode; and
   (e) a drain electrode,
wherein the gate dielectric layer, the gate electrode, the semiconductor layer, the source electrode, and the drain electrode are in any sequence as long as the gate electrode and the semiconductor layer both contact the gate dielectric layer, and the source electrode and the drain electrode both contact the semiconductor layer.

2. The transistor of claim 1, wherein the indolocarbazole is substituted by one or more substituents independently selected from the group consisting of a hydrocarbon group, a heteroatom containing group, and a halogen, or a mixture thereof.

3. The transistor of claim 1, wherein the indolocarbazole has one or more nitrogen substitutions and optionally has one or more peripheral substitutions.

4. The transistor of claim 1, wherein the number of the indolo moiety in the optionally substituted indolocarbazole is from 1 to 4.

5. The transistor of claim 1, wherein the number of the indolo moiety in the optionally substituted indolocarbazole is from 1 to 2.

6. The transistor of claim 1, wherein the optionally substituted indolocarbazole has a band gap of greater than about 1.8 eV.

7. The transistor of claim 1, wherein the optionally substituted indolocarbazole has a highest occupied molecular orbital energy level lower than about 4.9 eV from vacuum.

8. The transistor of claim 1, wherein the indolocarbazole comprises least one long chain alkyl group.

9. The transistor of claim 1, wherein the indolocarbazole is substituted with one or more substituents independently selected from the group consisting of a long chain alkyl group, an alkylphenyl, a phenyl, a chloro, an alkoxy, an optionally substituted thienyl, and an optionally substituted mino, or a mixture thereof.

10. A thin film transistor comprising:
   (a) a gate dielectric layer;
   (b) a gate electrode;
   (c) a predominately crystalline semiconductor layer;
   (d) a source electrode; and
   (e) a drain electrode, wherein the gate dielectric layer, the gate electrode, the semiconductor layer, the source electrode, and the drain electrode are in any sequence as long as the gate electrode and the semiconductor layer both contact the gate dielectric layer, and the source electrode and the drain electrode both contact the semiconductor layer, and wherein the semiconductor layer includes an indolocarbazole selected from the group consisting of structures (A), (B), (C), (D), (L), (F), and (G), or a mixture thereof:

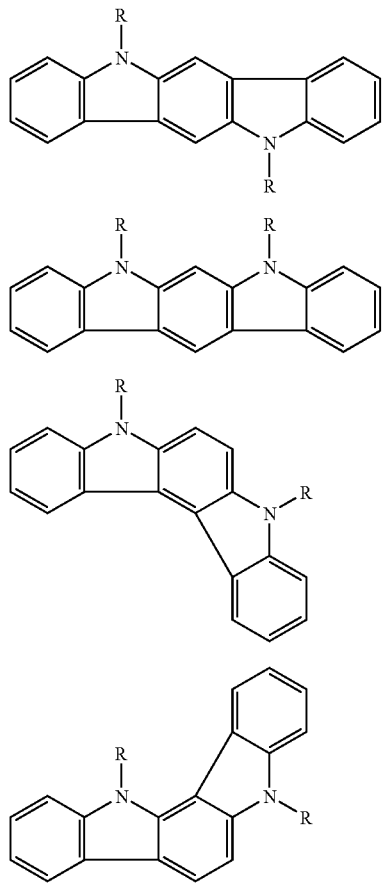

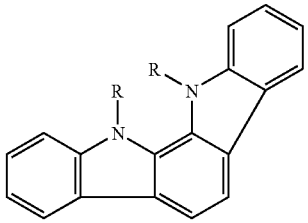

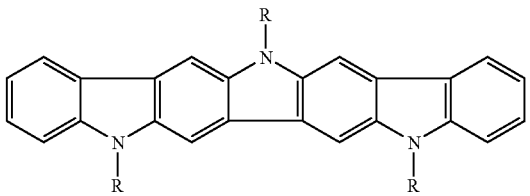

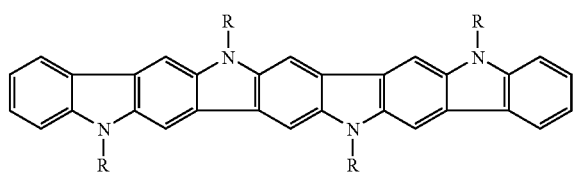

wherein for each of the structures (A) through (G), each R is independently selected from a group consisting of a hydrogen, a hydrocarbon group and a heteroatom-containing group, wherein each of the structures (A) through (G) is optionally peripherally substituted.

11. The transistor of claim 10, wherein for each of the structures (A) through (G), each R is independently selected from a group consisting of a hydrocarbon group and a heteroatom-containing group, wherein each of the structures (A) through (G) is optionally peripherally substituted.

12. The transistor of claim 11, wherein the hetero atom-containing group is independently selected from fluoroalkyl, fluoroaryl, alkoxy, carbonyl, carboxylate, amino, nitro, and cyano, an optionally substituted thienyl, or a mixture thereof.

13. The transistor of claim 10, wherein the optionally substituted indolocarbazole is selected from the group consisting of structures (1) through (18):

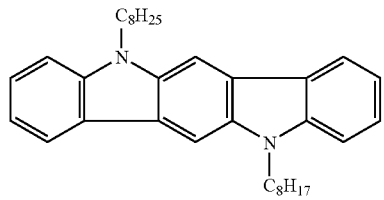

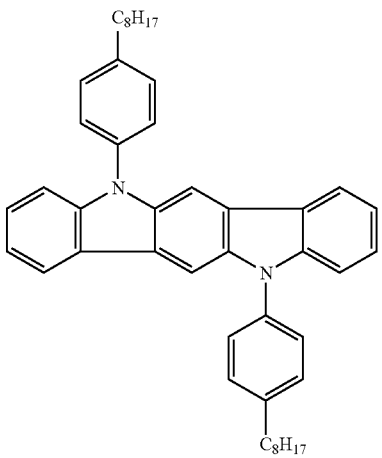

-continued
(3)
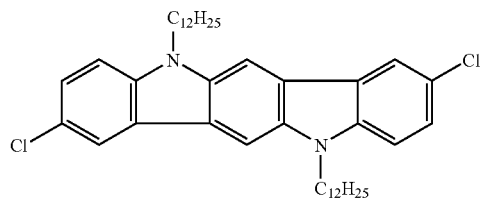
(4)
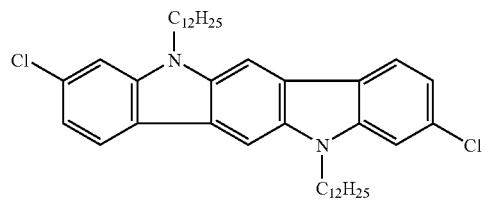
(5)
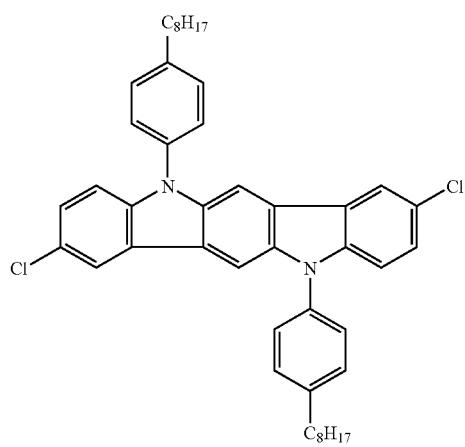
(6)
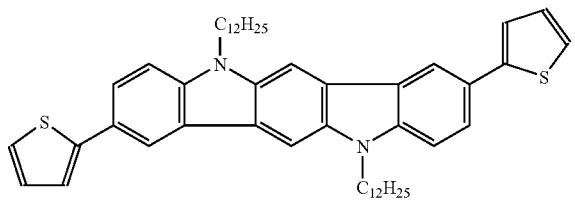
(7)
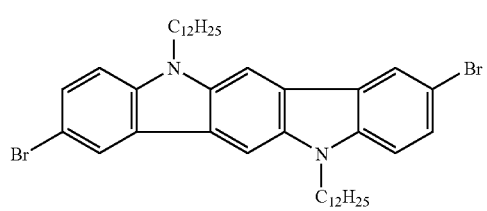
(8)
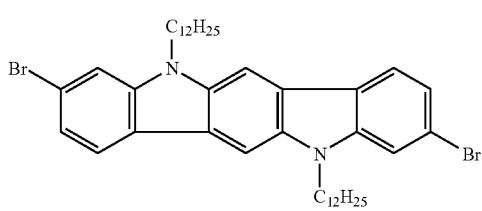
(9)
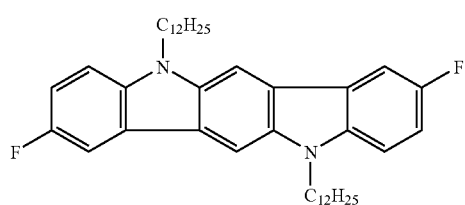
(10)
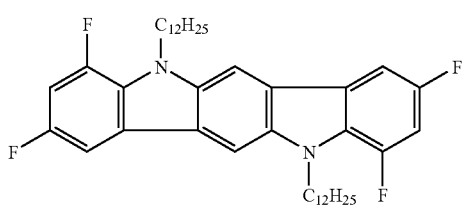
(11)
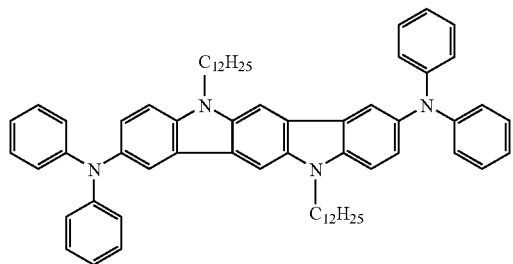
(12)
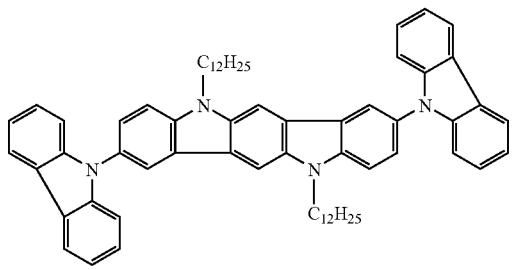

-continued
(13)
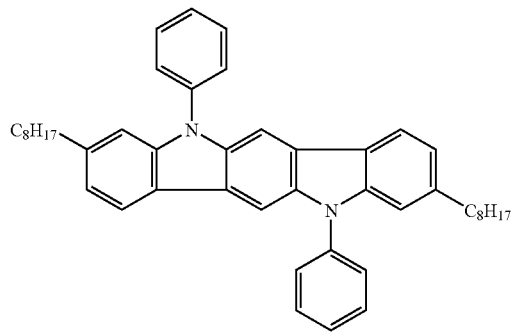
(14)
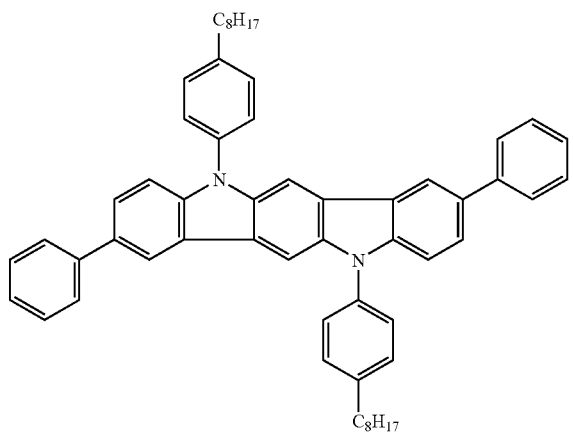
(15)
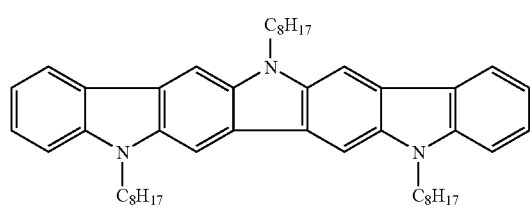
(16)
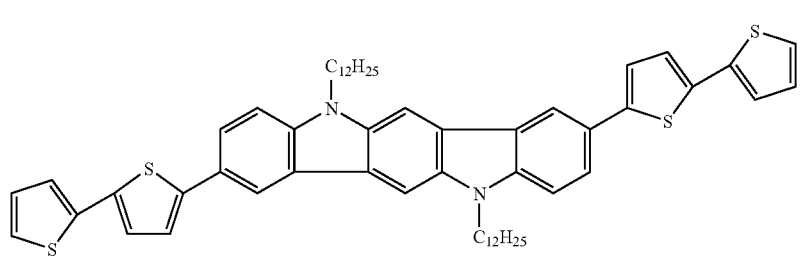
(17)
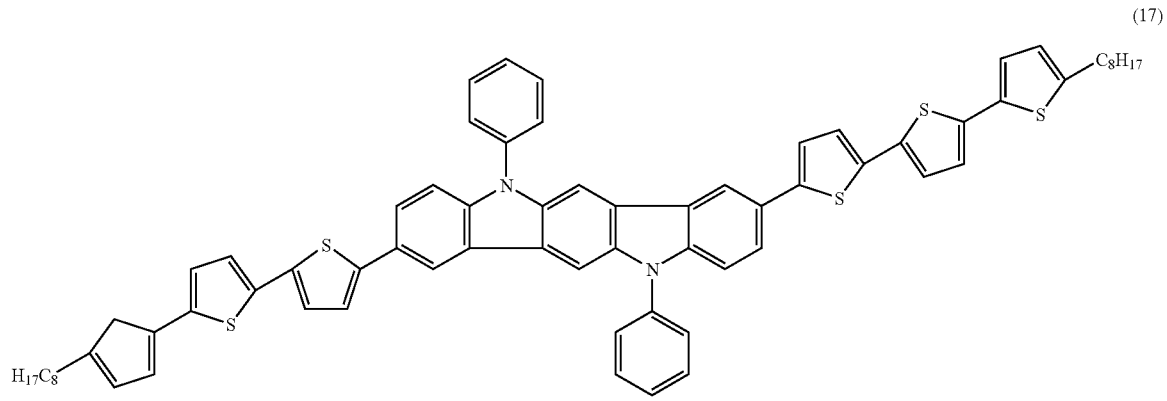

-continued

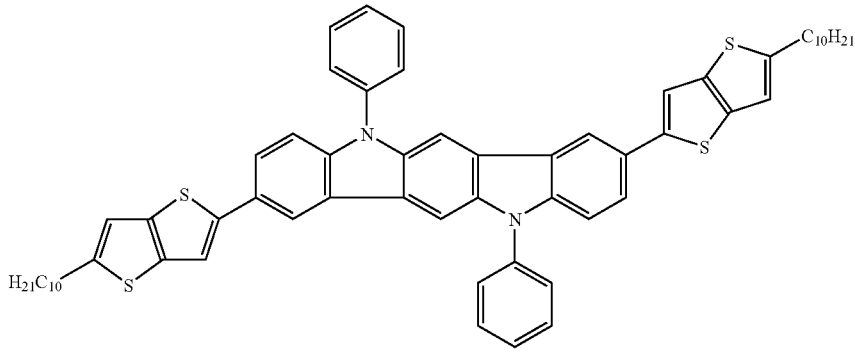

(18)

or a mixture thereof.

14. The transistor of claim 10, wherein the indolocarbazole has a band gap of greater than about 1.8 eV.

15. The transistor of claim 10, wherein the indolocarbazole has a highest occupied molecular orbital energy level lower than about 4.9 eV from vacuum.

16. The transistor of claim 10, wherein the indolocarbazole comprises at least one long chain alkyl group.

17. The transistor of claim 10, wherein the indolocarbazole is substituted with one or more substituents independently selected from the group consisting of a long chain alkyl group, an alkylphenyl, a phenyl, a chloro, an alkoxy, and an optionally substituted amino, an optionally substituted thienyl, or a mixture thereof.

* * * * *

UNITED STATES PATENT AND TRADEMARK OFFICE
CERTIFICATE OF CORRECTION

| | |
|---|---|
| PATENT NO. | : 7,456,424 B2 |
| APPLICATION NO. | : 11/167485 |
| DATED | : November 25, 2008 |
| INVENTOR(S) | : Yiliang Wu et al. |

It is certified that error appears in the above-identified patent and that said Letters Patent is hereby corrected as shown below:

In the Specification:

Column 1, line 28, after "Cooperative Agreement No.", please delete "70NANBOH3033" and insert --70NANB0H3033--.

Signed and Sealed this
Tenth Day of September, 2013

Teresa Stanek Rea
*Acting Director of the United States Patent and Trademark Office*